US009435049B2

(12) United States Patent
Thorum

(10) Patent No.: US 9,435,049 B2
(45) Date of Patent: Sep. 6, 2016

(54) ALKALINE PRETREATMENT FOR ELECTROPLATING

(71) Applicant: Lam Research Corporation, Fremont, CA (US)

(72) Inventor: Matthew Thorum, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 58 days.

(21) Appl. No.: 14/085,262

(22) Filed: Nov. 20, 2013

(65) Prior Publication Data
US 2015/0140814 A1 May 21, 2015

(51) Int. Cl.
| | |
|---|---|
| *H01L 21/768* | (2006.01) |
| *C25D 3/38* | (2006.01) |
| *H01L 21/027* | (2006.01) |
| *C25D 5/02* | (2006.01) |
| *C25D 7/12* | (2006.01) |
| *C25D 5/40* | (2006.01) |
| *H01L 21/67* | (2006.01) |
| *H01L 21/288* | (2006.01) |
| *C23C 18/16* | (2006.01) |

(Continued)

(52) U.S. Cl.
CPC .............. *C25D 5/40* (2013.01); *C23C 18/1653* (2013.01); *C25D 5/022* (2013.01); *C25D 7/123* (2013.01); *H01L 21/2885* (2013.01); *H01L 21/67051* (2013.01); *H01L 21/76861* (2013.01); *H01L 21/76873* (2013.01); *H01L 21/76898* (2013.01); *C23C 18/34* (2013.01); *C23C 18/36* (2013.01); *C25D 3/38* (2013.01)

(58) Field of Classification Search
None
See application file for complete search history.

(56) References Cited

U.S. PATENT DOCUMENTS

| 1,255,395 A | 2/1918 | Duram |
| 3,360,248 A | 12/1967 | Lindeman et al. |
| 3,849,002 A | 11/1974 | Hach |

(Continued)

FOREIGN PATENT DOCUMENTS

| EP | 0 860 866 | 8/1998 |
| JP | 2006-004955 | 1/2006 |

(Continued)

OTHER PUBLICATIONS

U.S. Appl. No. 09/872,340, filed May 31, 2001, entitled "Methods and Apparatus for Bubble Removal in Wafer Wet Processing".

(Continued)

*Primary Examiner* — Khaja Ahmad
(74) *Attorney, Agent, or Firm* — Weaver Austin Villeneuve & Sampson LLP

(57) ABSTRACT

Prior to electrodeposition, a semiconductor wafer having one or more recessed features, such as through silicon vias (TSVs), is pretreated by contacting the wafer with a pre-wetting liquid comprising a buffer (such as a borate buffer) and having a pH of between about 7 and about 13. This pre-treatment is particularly useful for wafers having acid-sensitive nickel-containing seed layers, such as NiB and NiP. The pre-wetting liquid is preferably degassed prior to contact with the wafer substrate. The pretreatment is preferably performed under subatmospheric pressure to prevent bubble formation within the recessed features. After the wafer is pretreated, a metal, such as copper, is electrodeposited from an acidic electroplating solution to fill the recessed features on the wafer. The described pretreatment minimizes corrosion of seed layer during electroplating and reduces plating defects.

19 Claims, 9 Drawing Sheets

(51) Int. Cl.
   *C23C 18/34* (2006.01)
   *C23C 18/36* (2006.01)

(56) References Cited

U.S. PATENT DOCUMENTS

| | | |
|---|---|---|
| 4,101,919 A | 7/1978 | Ammann |
| 4,229,191 A | 10/1980 | Moore |
| 4,297,217 A | 10/1981 | Hines et al. |
| 4,816,081 A | 3/1989 | Mehta et al. |
| 5,000,827 A | 3/1991 | Schuster et al. |
| 5,221,449 A | 6/1993 | Colgan et al. |
| 5,281,485 A | 1/1994 | Colgan et al. |
| 5,427,674 A | 6/1995 | Langenskiold et al. |
| 5,482,611 A | 1/1996 | Helmer et al. |
| 5,555,234 A | 9/1996 | Sugimoto |
| 5,800,626 A | 9/1998 | Cohen et al. |
| 5,831,727 A | 11/1998 | Stream |
| 5,982,762 A | 11/1999 | Anzai et al. |
| 5,985,762 A | 11/1999 | Geffken et al. |
| 6,004,470 A | 12/1999 | Abril |
| 6,017,437 A | 1/2000 | Ting et al. |
| 6,074,544 A | 6/2000 | Reid et al. |
| 6,099,702 A | 8/2000 | Reid et al. |
| 6,110,346 A | 8/2000 | Reid et al. |
| 6,124,203 A | 9/2000 | Joo et al. |
| 6,126,798 A | 10/2000 | Reid et al. |
| 6,139,712 A | 10/2000 | Patton et al. |
| 6,156,167 A | 12/2000 | Patton et al. |
| 6,159,354 A | 12/2000 | Contolini et al. |
| 6,162,344 A | 12/2000 | Reid et al. |
| 6,179,973 B1 | 1/2001 | Lai et al. |
| 6,179,983 B1 | 1/2001 | Reid et al. |
| 6,193,854 B1 | 2/2001 | Lai et al. |
| 6,193,859 B1 | 2/2001 | Contolini et al. |
| 6,217,716 B1 | 4/2001 | Fai Lai |
| 6,221,757 B1 | 4/2001 | Schmidbauer et al. |
| 6,251,242 B1 | 6/2001 | Fu et al. |
| 6,261,433 B1 | 7/2001 | Landau |
| 6,274,008 B1 | 8/2001 | Gopalraja et al. |
| 6,277,249 B1 | 8/2001 | Gopalraja et al. |
| 6,333,275 B1 | 12/2001 | Feng et al. |
| 6,413,388 B1 | 7/2002 | Uzoh et al. |
| 6,503,376 B2 | 1/2003 | Toyoda et al. |
| 6,540,899 B2 | 4/2003 | Keigler |
| 6,544,585 B1 | 4/2003 | Kuriyama et al. |
| 6,551,487 B1 | 4/2003 | Reid et al. |
| 6,562,204 B1 | 5/2003 | Mayer et al. |
| 6,569,299 B1 | 5/2003 | Reid et al. |
| 6,582,578 B1 | 6/2003 | Dordi et al. |
| 6,689,257 B2 | 2/2004 | Mishima et al. |
| 6,753,250 B1 | 6/2004 | Hill et al. |
| 6,800,187 B1 | 10/2004 | Reid et al. |
| 6,964,740 B2 | 11/2005 | Morse et al. |
| 6,964,792 B1 | 11/2005 | Mayer et al. |
| 7,014,679 B2 | 3/2006 | Parekh et al. |
| 7,097,410 B1 | 8/2006 | Reid et al. |
| 7,270,734 B1 * | 9/2007 | Schetty, III ............... C25D 5/10 205/118 |
| 7,303,992 B2 | 12/2007 | Paneccasio et al. |
| 7,670,950 B2 | 3/2010 | Richardson et al. |
| 7,686,927 B1 | 3/2010 | Reid et al. |
| 7,776,741 B2 | 8/2010 | Reid et al. |
| 8,404,095 B2 | 3/2013 | Perkins et al. |
| 8,962,085 B2 | 2/2015 | Mayer et al. |
| 8,992,757 B2 | 3/2015 | Willey et al. |
| 2001/0015321 A1 | 8/2001 | Reid et al. |
| 2001/0035346 A1 | 11/2001 | Maeda |
| 2002/0027080 A1 | 3/2002 | Yoshioka et al. |
| 2002/0029973 A1 | 3/2002 | Maydan |
| 2002/0084183 A1 | 7/2002 | Hanson et al. |
| 2002/0084189 A1 | 7/2002 | Wang et al. |
| 2002/0195352 A1 | 12/2002 | Mayer et al. |
| 2003/0070941 A1 | 4/2003 | Hirao |
| 2003/0116439 A1 * | 6/2003 | Seo et al. ............... 205/125 |
| 2004/0065561 A1 | 4/2004 | Chalyt et al. |
| 2004/0084315 A1 | 5/2004 | Mizohata et al. |
| 2004/0188257 A1 | 9/2004 | Klocke et al. |
| 2004/0198190 A1 | 10/2004 | Basol et al. |
| 2004/0200725 A1 | 10/2004 | Yahalom et al. |
| 2004/0262165 A1 | 12/2004 | Kanda et al. |
| 2005/0026455 A1 | 2/2005 | Hamada et al. |
| 2005/0255414 A1 | 11/2005 | Inabe et al. |
| 2006/0102485 A1 | 5/2006 | Nakano et al. |
| 2006/0141157 A1 | 6/2006 | Sekimoto et al. |
| 2006/0207886 A1 | 9/2006 | Isono et al. |
| 2006/0266393 A1 | 11/2006 | Verhaverbeke et al. |
| 2006/0283710 A1 | 12/2006 | Cohen et al. |
| 2008/0149487 A1 | 6/2008 | Lee |
| 2008/0200018 A1 | 8/2008 | Kawamoto |
| 2010/0084275 A1 | 4/2010 | Hanafusa |
| 2010/0200412 A1 | 8/2010 | Reid et al. |
| 2010/0200960 A1 | 8/2010 | Angyal et al. |
| 2010/0320081 A1 | 12/2010 | Mayer et al. |
| 2010/0320609 A1 | 12/2010 | Mayer et al. |
| 2011/0043239 A1 | 2/2011 | Tomita et al. |
| 2011/0284386 A1 * | 11/2011 | Willey et al. ............... 205/96 |
| 2012/0255864 A1 * | 10/2012 | Nagai ............... C25D 5/34 205/210 |
| 2013/0143071 A1 * | 6/2013 | Kleinle ............... 428/658 |
| 2013/0171833 A1 | 7/2013 | Buckalew et al. |
| 2014/0097088 A1 | 4/2014 | Stowell et al. |
| 2014/0230860 A1 | 8/2014 | Chua et al. |
| 2015/0096883 A1 | 4/2015 | Mayer et al. |
| 2015/0159289 A1 | 6/2015 | Willey et al. |
| 2015/0179458 A1 | 6/2015 | Mayer et al. |

FOREIGN PATENT DOCUMENTS

| | | |
|---|---|---|
| JP | 2007-138304 | 6/2007 |
| JP | 2009-064599 | 3/2009 |
| KR | 10-1999-0029433 | 4/1999 |
| KR | 10-2001-0052062 | 6/2001 |
| KR | 10-2004-0020882 | 3/2004 |
| TW | 1281516 | 5/2007 |
| WO | WO 99/10566 | 3/1999 |
| WO | WO 99/41434 | 8/1999 |
| WO | WO 01/68952 | 9/2001 |
| WO | WO 02/062466 | 8/2002 |
| WO | WO 2007/112768 | 10/2007 |
| WO | WO 2012022660 A1 * | 2/2012 |
| WO | WO 2010/148147 | 12/2012 |

OTHER PUBLICATIONS

U.S. Appl. No. 12/961,274, filed Dec. 6, 2010 entitled "Deionized Water Conditioning System and Methods".
US Office Action dated Aug. 31, 2005 in U.S. Appl. No. 09/872,340.
US Office Action dated Apr. 14, 2005 in U.S. Appl. No. 09/872,340.
US Office Action dated Jan. 18, 2006 in U.S. Appl. No. 09/872,340.
US Office Action dated May 26, 2006 in U.S. Appl. No. 09/872,340.
US Office Action dated Nov. 8, 2006 in U.S. Appl. No. 09/872,340.
US Final Office Action dated Mar. 14, 2007 in U.S. Appl. No. 09/872,340.
US Office Action dated Jun. 27, 2012 in U.S. Appl. No. 12/684,787.
US Office Action dated Apr. 8, 2013 in U.S. Appl. No. 12/684,787.
US Final Office Action dated Jul. 24, 2013 in U.S. Appl. No. 12/684,787.
US Office Action dated Apr. 12, 2011 in U.S. Appl No. 12/684,792.
US Final Office Action dated Jul. 26, 2011 in U.S. Appl. No. 12/684,792.
US Office Action dated Sep. 27, 2013 in U.S. Appl. No. 12/684,792.
US Office Action dated Jun. 6, 2013 in U.S. Appl. No. 12/961,274.
PCT International Search Report and Witten Opinion, dated Jan. 5, 2011, issued in PCT/US2010/038901.
PCT International Preliminary Report on Patentability and Written Opinion dated Jan. 5, 2012, issued in PCT/US2010/038901.
KR Office Action, dated Jan. 5, 2012 in KR Application No. 2010-7026340.
Kondo et al., "High Speed Through Silicon Via Filling by Copper Electrodeposition," *Electrochemical and Solid State Letters*, 13 (5) D26-D28 (2010).

(56) References Cited

OTHER PUBLICATIONS

US Office Action dated Sep. 30, 2013 in U.S. Appl. No. 13/110,488.
U.S. Appl. No. 14/613,306, filed Feb. 3, 2015, entitled "Geometry and Process Optimization for Ultra-High RPM Plating".
U.S. Appl. No. 14/593,676, filed Jan. 9, 2015, entitled "Wetting Pretreatment for Enhanced Damascene Metal Filling".
U.S. Appl. No. 14/326,899, filed Jul. 9, 2014, entitled "Apparatus for Wetting Pretreatment for Enhanced Damascene Metal Filling".
U.S. Appl. No. 13/460,423, filed Apr. 30, 2012, titled "Wetting Wave Front Control for Reduced Air Entrapment During Wafer Entry Into Electroplating Bath.".
US Office Action, dated Oct. 29, 2013 in U.S. Appl. No. 12/684,787.
US Final Office Action, dated Mar. 3, 2014 in U.S. Appl. No. 12/684,787.
US Office Action, dated Aug. 26, 2014 in U.S. Appl. No. 12/684,787.
US Notice of Allowance, dated Oct. 10, 2014 in U.S. Appl. No. 12/684,787.
US Notice of Allowance (Supplemental Notice of Allowability), dated Oct. 22, 2014 in U.S. Appl. No. 12/684,787.
US Notice of Allowance (Supplemental Notice of Allowability), dated Oct. 28, 2014 in U.S. Appl. No. 12/684,787.
US Final Office Action, dated Oct. 28, 2013, issued in U.S. Appl. No. 12/961,274.
US Notice of Allowance, dated Jan. 21, 2014, issued in U.S. Appl. No. 12/961,274.
US Office Action, dated Jul. 25, 2014, issued in U.S. Appl. No. 12/961,274.
US Final Office Action, dated Nov. 28, 2014, issued in U.S. Appl. No. 12/961,274.
US Final Office Action dated Mar. 14, 2014 in U.S. Appl. No. 13/110,488.
US Office Action dated Jul. 9, 2014 in U.S. Appl. No. 13/110,488.
US Notice of Allowance dated Nov. 21, 2014 in U.S. Appl. No. 13/110,488.
Chinese First Office Action dated Aug. 14, 2014 issued in CN Application No. 201080026847.7.
Taiwan Office Action dated Nov. 18, 2014 issued in TW Application No. 099119625.
Bozzini et al., (2006) "An electrochemical and in situ SERS study of Cu electrodeposition from acidic sulphate solutions in the presence of 3-diethylamino-7-(4-dimethylaminophenylazo)-5-phenylphenazinium chloride (Janus Green B)", *Journal of Applied Electrochemistry*, 36:973-981.
Kim, S-K., et al. (2006) "Cationic Surfactants for the Control of Overfill Bumps in Cu Superfilling" *Journal of Electrochemical Society*, 153(12):C826-C833.
Luhn et al., (2009) "Filling of microvia with an aspect ratio of 5 by copper electrodeposition," Electrochimica Acta, 54:2504-2508.
US Final Office Action, dated Apr. 10, 2014, issued in U.S. Appl. No. 12/684,792.
US Office Action, dated Jul. 29, 2015, issued in U.S. Appl. No. 13/775,987.
US Notice of Allowance, dated May 27, 2015, issued in U.S. Appl. No. 12/961,274.
Chinese First Office Action dated Dec. 2, 2014 issued in CN Application No. 201110136214.8.
Chinese Second Office Action dated Aug. 5, 2015 issued in CN Application No. 201110136214.8.
Taiwanese Office Action dated Jun. 18, 2015 issued in TW Application No. 100117466.

\* cited by examiner

ALKALINE PRETREATMENT FOR ELECTROPLATING

FIELD OF THE INVENTION

The embodiments disclosed herein pertain to pretreatment methods for electroplating. More specifically, embodiments relate to pre-wetting methods for treating a semiconductor wafer prior to electrodepositing conductive materials onto the wafer for integrated circuit manufacturing.

BACKGROUND

In integrated circuit manufacturing, a conductive material, such as copper, is often deposited by electroplating onto a seed layer of metal to fill one or more recessed features on the wafer substrate. Electroplating is a method of choice for depositing metal into the vias and trenches of the wafer during damascene processing, and is also used to fill Through-Silicon Vias (TSVs), which are relatively large vertical electrical connections used in 3D integrated circuits and 3D packages.

During electroplating, electrical contacts are made to the seed layer (typically at the periphery of the wafer), and the wafer is electrically biased to serve as a cathode. The wafer is brought into contact with an electroplating solution, which contains ions of metal to be plated, and an acid that provides sufficient conductivity to the electroplating solution. For example, typical electroplating solutions for electrodeposition of copper are acidic solutions containing copper sulfate and sulfuric acid or copper methanesulfonate and methanesulfonic acid. The plating solutions may also contain additives, known as accelerators, suppressors, and levelers that modulate electrodeposition rates on different surfaces of the substrate. These plating solutions typically have a pH of less than about 1. Electroplating is typically conducted for an amount of time that is sufficient to fill the recessed features with metal. Then, the unwanted metal deposited on the field regions of the wafer is removed in a planarization operation, such as by a chemical mechanical polishing (CMP).

SUMMARY

One of the problems encountered during electroplating, is the formation of voids and defects in the filled recessed features due to damage to the seed layer, and/or due to imbalances of electrolyte composition within the recessed features at the beginning of electroplating. For example, some seed layers are sensitive to the acidic environment of the plating solution and may be subject to corrosion. These acid-sensitive seed layers include nickel-containing layers, such as NiB and NiP layers. Nickel-containing seed layers, however, are preferred seed layers in many applications, because they can be deposited by electroless deposition in a highly conformal manner. Embodiments described herein provide a wafer pretreatment method and an apparatus for treating semiconductor wafers having acid-sensitive seed layers prior to electroplating. Provided method is capable of significantly reducing damage to the seed layers and allows void-free electrofill on acid-sensitive seed layers without having to resort to acid-free electroplating solutions.

In a first aspect, a method of electroplating a metal on a wafer substrate comprising one or more recessed features is described. The method includes: providing a wafer substrate having an exposed nickel-containing layer on at least a portion of its surface; contacting the wafer substrate with a pre-wetting liquid, the liquid comprising a buffer and having a pH in a range of between about 7 and about 13 to pre-wet the nickel-containing layer on the wafer substrate; and then electrodepositing the metal (e.g., copper) onto the nickel-containing layer using an acidic plating solution, wherein the electrodeposited metal at least partially fills the one or more recessed features.

In some embodiments the pH of the pre-wetting liquid is between about 9 and about 11, such as about 11, and the pre-wetting liquid includes a borate buffer. In some embodiments, the concentration of the borate is between about 10 mM and about 1M, such as around 0.1 M. Other buffers that can be used for pretreatment include a carbonate buffer, and a phosphate buffer.

The pre-wetting liquid typically includes a pH adjustor that is in some embodiments selected from the group consisting of tetraalkylammonium hydroxide and an alkali metal hydroxide (e.g., KOH). In other embodiments the pH adjustor includes ammonia.

In some embodiments the pre-wetting liquid further includes a compound from the class of polyalkylene glycols. In some embodiments, the pre-wetting liquid includes a borate (e.g., at a concentration of about 0.1 M), KOH, a compound from the class of polyalkylene glycols, and has a pH of about 11.

The pre-wetting liquid, in some embodiments, is degassed prior to contacting the wafer substrate. In some embodiments the pressure in the pre-wetting chamber is reduced to subatmospheric pressure prior to contacting the wafer substrate with the pre-wetting liquid. The pre-wetting liquid can be delivered onto the wafer using a number of methods. In some embodiments, the liquid is sprayed onto the wafer substrate. The wafer substrate may be in a substantially horizontal orientation, when it is contacted with the pre-wetting liquid.

In some embodiments the method is used to fill one or more TSVs on a wafer substrate. In some embodiments, the method further includes applying photoresist to the wafer substrate; exposing the photoresist to light; patterning the resist and transferring the pattern to the work piece; and selectively removing the photoresist from the work piece.

In another aspect, an apparatus for electroplating a metal on a nickel-containing layer on a wafer substrate comprising one or more recessed features, is provided. The apparatus includes: a pre-wetting chamber configured for delivering a pre-wetting liquid onto the wafer substrate; a plating vessel configured for holding an acidic plating solution, wherein the apparatus is configured for electrodepositing a metal from the plating solution onto the nickel-containing layer on the wafer substrate; and a controller having program instructions and/or logic for implementation of one or more methods provided herein. For example, the controller may include instructions and/or logic for: contacting the wafer substrate with the pre-wetting liquid, the liquid comprising a buffer and having a pH in a range of between about 7 and about 13 to pre-wet the nickel-containing layer on the wafer substrate; and electrodepositing the metal onto the nickel-containing layer using the acidic plating solution.

In another aspect a pre-wetting liquid is provided, where the liquid contains a borate buffer comprising borate and a pH adjustor selected from the group consisting of a tetraalkylammonium hydroxide and an alkaline metal hydroxide; and a compound from the class of polyalkylene glycols, wherein the pH of the pre-wetting liquid is between about 8 and about 13.

In another aspect, a non-transitory computer machine-readable medium comprising program instructions is provided. The program instructions for control of an electroplating apparatus comprise code for performing any of the methods described above.

These and other features and advantages of the present invention will be described in more detail with reference to the figures and associated description that follows.

DETAILED DESCRIPTION

Figure 1:
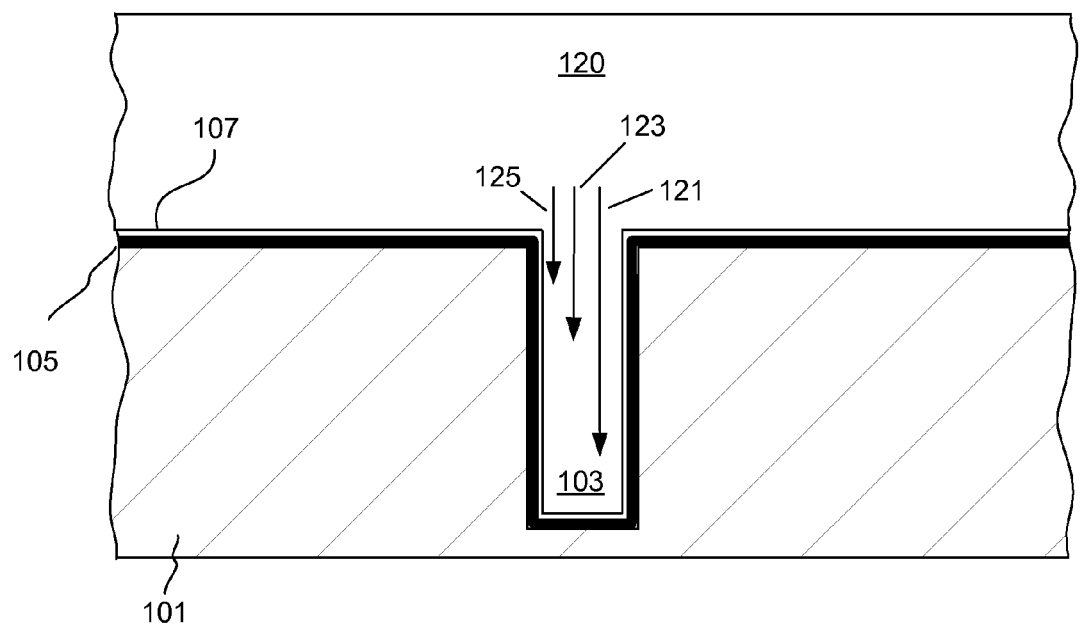
FIG. 1 is a schematic representation of a cross-section of a wafer substrate having a TSV in contact with an electroplating solution, illustrating relative rates of diffusion for different solution components, as they move into the via.

In the following description, the invention is presented in terms of certain specific configurations and processes to help explain how it may be practiced. The invention is not limited to these specific embodiments. Examples of specific embodiments of the invention are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the scope and equivalents of the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

In this disclosure various terms are used to describe a semiconductor work piece. For example, "wafer" and "substrate" are used interchangeably. The process of depositing, or plating, metal onto a conductive surface via an electrochemical reaction is referred to generally as electroplating or electrofilling. Copper-containing metal in this application is referred to as "copper" which includes without limitation, pure copper metal, copper alloys with other metals, and copper metal impregnated with non-metallic species, such as with organic and inorganic compounds used during electrofill operations (e.g., levelers, accelerators, suppressors, surface-active agents, etc.). The terms "borate", "carbonate", "citrate" and "phosphate" are used in this disclosure without limitation to including the corresponding conjugate acid, as will be understood by one of skill in the art. For example, the "borate buffer" may include both borate and boric acid.

While electrofilling processes will be primarily described making reference to copper plating, it is understood that the methods provided herein and associated apparatus configurations can be used to perform plating of other metals and alloys, such as Au, Ag, Ni, Ru, Pd, Sn, Pb/Sn alloy, etc. The plating electrolytes will include a source of required metal ions (metal salt), and typically an acid in order to increase electrolyte conductivity.

The described pretreatment processes can be practiced on any type of seed layer (e.g., copper, nickel, ruthenium, tungsten, etc.), but are particularly useful for acid-sensitive seed layers. These acid-sensitive seed layers include nickel-containing seed layers, particularly those deposited by electroless deposition and/or having other elements in addition to nickel (e.g., about 1% atomic or more of another element). Examples of these nickel-containing layers are NiB layers and NiP layers, where the formulas do not imply 50% Ni stoichiometry. In some embodiments, the content of the other element (e.g., boron in NiB and phosphorus in NiP) is between about 0.01-50 atomic %, such as about 25 atomic %. Other examples of acid-sensitive layers that may benefit from alkaline pretreatment include extremely thin layers of any composition (e.g. copper seed layers).

Provided methods can be used for pre-treatments prior to electroplating with any type of electrolyte. The pre-treatment benefits are particularly pronounced before electroplating with highly acidic and corrosive plating solutions, having a pH lower than 3 such as lower than 1.

Provided methods can be used for filling a variety of recessed features, but are particularly advantageous for filling TSVs, which are recessed features that have relatively large sizes and high aspect ratios. TSVs typically have aspect ratios of 5:1 and greater, such as 10:1 and greater, and even 20:1 and greater (e.g., reaching about 30:1), with widths at opening of about 1 μm or greater, such as about 5 μm or greater, and depths of about 20 μm or greater, such as 50 μm or greater, and 100 μm or greater. Examples of TSVs include 5×50 μm and 10×100 μm features. Such large recessed features, when coated with acid-sensitive seed layers are particularly difficult to fill using conventional techniques.

FIG. 1 illustrates a model of distribution of plating solution components upon contact of the plating solution with the substrate having a recessed feature. A cross-sectional schematic view of the substrate is shown. The substrate includes a layer of dielectric material 101, and a via 103 embedded in the dielectric. A conformal diffusion barrier layer 105, such as a W/WN bilayer resides on the layer of dielectric. A conformal seed layer, such as NiB or NiP layer, 107, resides on top of the barrier layer 105, and is exposed to the electroplating solution 120. The electroplating solution contains a metal salt, an acid, an accelerator and a suppressor. Upon contact of electroplating solution with the substrate, different components of the plating solution travel to the bottom of the recessed feature at different speeds. The H$^+$ ions represented by arrow 121 travel to the bottom of the via significantly faster than other components. Other ions and the accelerator represented by arrow 123 travel about 10 times slower than the protons, while the suppressor molecules represented by arrow 125, travel even slower, about 100 times slower than the protons. As a result, upon contact with the electroplating solution, an unbalanced proton-rich environment is created at the bottom of the recess, potentially leading to depolarization of seed layer and to corrosion on the surface of seed layer.

Figure 2:
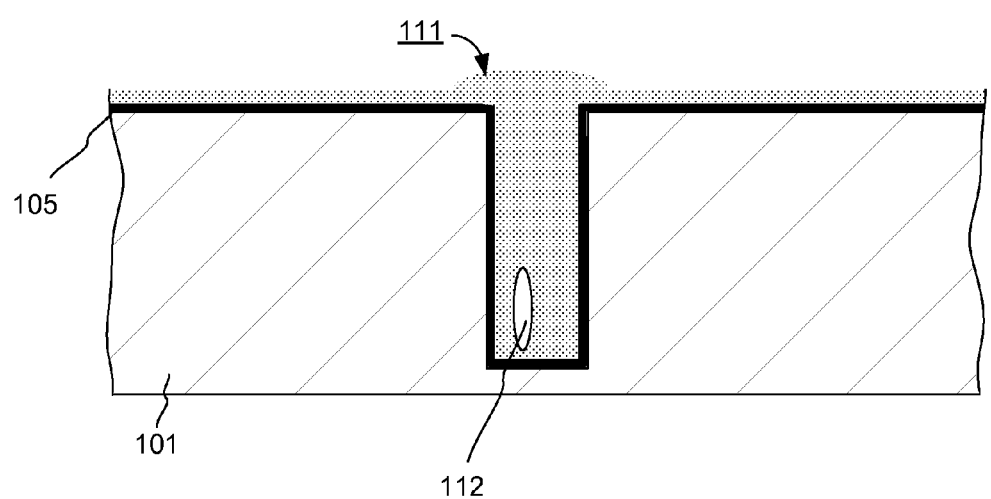
FIG. 2 is a schematic representation of a cross-section of a wafer substrate processed without alkaline pre-treatment, illustrating a copper-filled TSV having a void at the bottom of the via.

When the recessed feature having an acid-sensitive seed layer is electrofilled without an alkaline pretreatment, a void is often formed at the bottom of the via, as illustrated by FIG. 2. FIG. 2 shows a cross-sectional view of the substrate after the recessed feature has been filled with metal using an acidic electrolyte, where the only pre-treatment was a pre-wetting with a degassed deionized water under reduced pressure. As illustrated, the electrodeposited metal 111 fills the recessed feature, and a void 112 is formed at the bottom portion of the recessed feature.

Figure 3A:
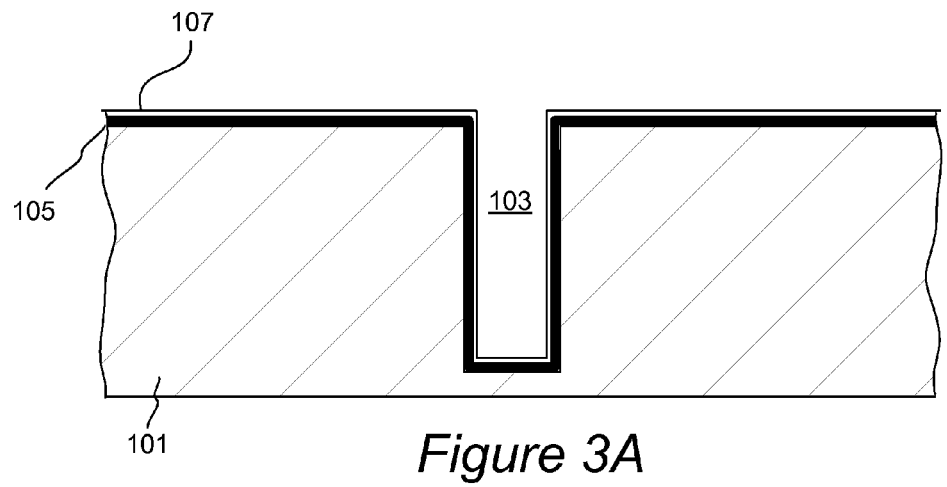
FIGS. 3A-3D present schematic representations of semiconductor device cross-sections at various stages of TSV processing, in accordance with an embodiment presented herein.
Figure 3B:
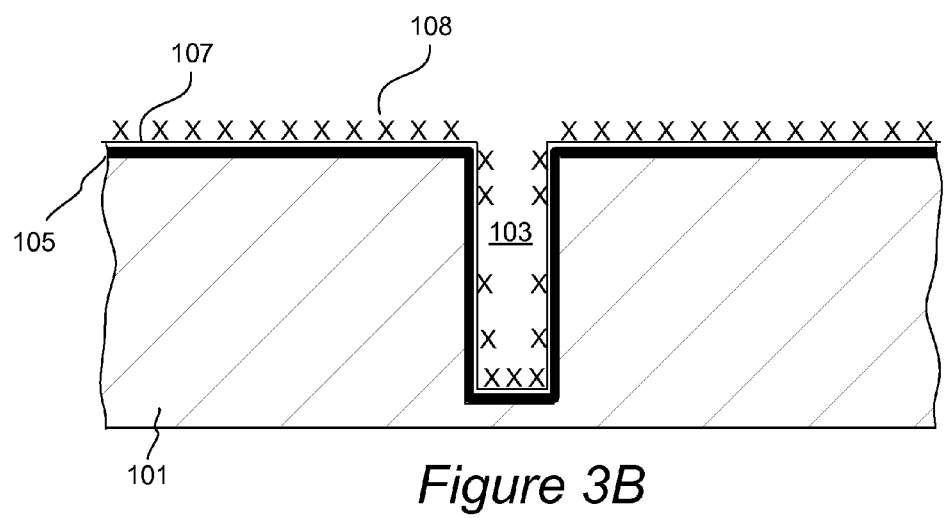
Figure 3C:
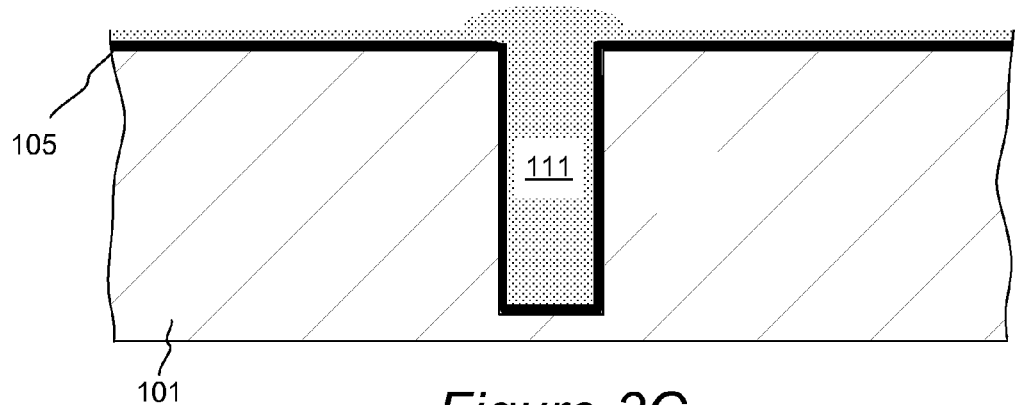
Figure 3D:
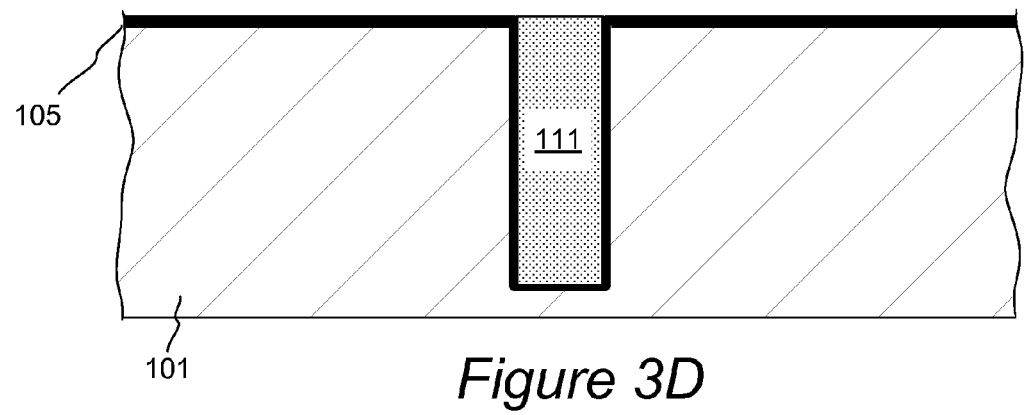
Figure 4:
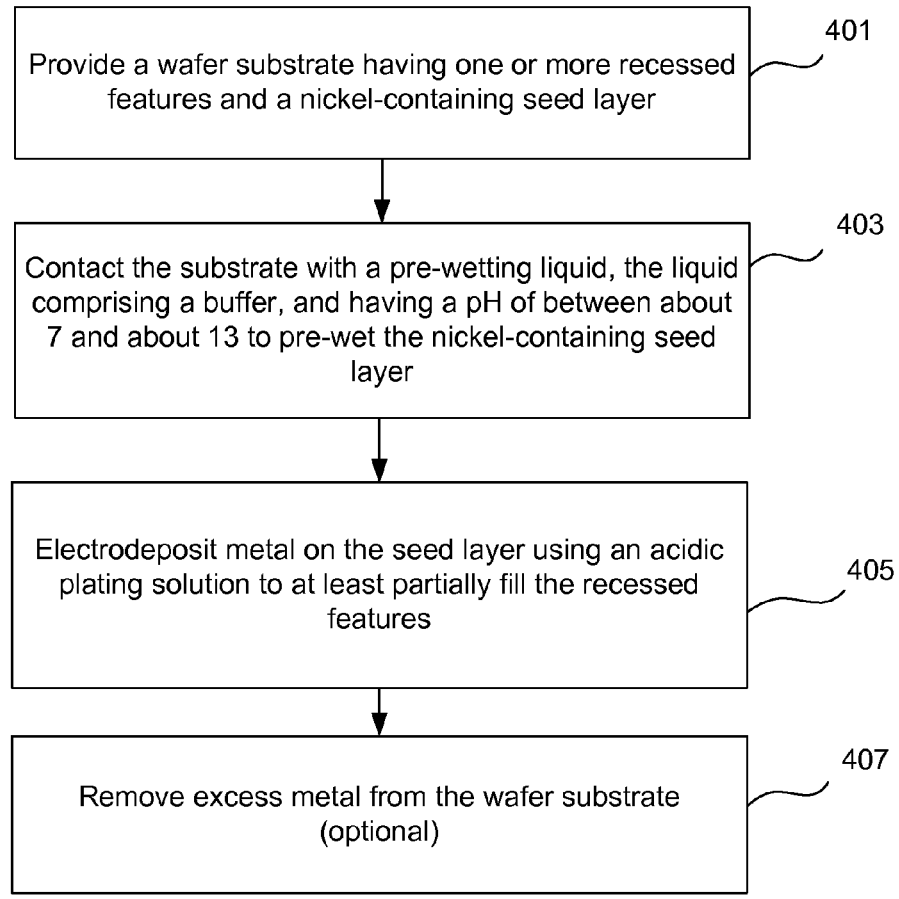
FIG. 4 presents a process flow diagram for a deposition method in accordance with an embodiment provided herein.

The pretreatment method that can prevent formation of such voids is illustrated by an exemplary process flow diagram shown in FIG. 4 and by a sequence of cross-sectional views of the substrate undergoing processing, shown in FIGS. 3A-3D. In operation 401, a wafer substrate having one or more recessed features and a nickel-containing seed layer is provided. A cross-sectional view of an example of such substrate is shown in FIG. 3A. FIG. 3A shows a TSV 103 residing in a layer of dielectric 101. FIG. 3A shows a portion of the substrate containing one via. In many implementations, the substrate is a semiconductor wafer that contains hundreds, or even millions of vias.

The dielectric layer 101 is lined with a diffusion barrier layer 105 (e.g., Ta, TaN, Ti, TiN, W, WN or a combination thereof), and has a nickel-containing layer 107 deposited on the barrier layer 105. The nickel-containing seed layer 107 conformally lines the interior walls of the TSV 103, and also resides on the field region over the diffusion barrier layer. In some embodiments the nickel containing seed layer is a NiB or NiP layer deposited by electroless deposition. Electroless deposition offers advantages over physical vapor deposition (PVD), because it deposits layers that are more conformal than PVD layers. In electroless deposition of nickel, the substrate is contacted with a nickel salt and a reducing agent (e.g., a hypophosphate, a dialkylaminoborane, or sodium borohydride) to form a nickel-containing layer. Depending on the nature of the reducing agent, a NiB layer or a NiP layer is formed. For example, the use of boron-containing reducing agent provides NiB layers, and the use of hypophosphate or other phosphorus-containing reducing agent results in formation of NiP layers.

The substrate having the exposed nickel-containing seed layer is then subjected to a pretreatment, as shown in operation 403 of FIG. 4. The substrate is contacted with a prewetting liquid, where the liquid contains a buffer and has a pH of between about 7 and about 13, such as between about 8 and about 12, such as between about 9 and about 11. Examples of suitable buffers include a borate buffer, a carbonate buffer, a citrate buffer, and a phosphate buffer. The buffer solution will typically also contain a pH adjustor. In some embodiments, the pH adjustor is preferably a non-complexing base. Suitable non-complexing pH adjustors include alkali metal hydroxides (e.g., KOH, NaOH), and tetraalkylammonium hydroxides (e.g., tetramethylammonium hydroxide). In other embodiments, the pH adjustor may have complexing properties. Such pH adjustors include ammonia and amines. It is a significant feature of the provided embodiment that the pre-wetting liquid is a buffer, meaning that its pH does not become acidic immediately upon contact with the acidic plating solution, but can remain basic for a period of time after the initial contact with the plating solution, thereby allowing for defect-free plating.

In some embodiments the pre-wetting liquid can also include other compounds that are useful for pretreatment of the substrate such as wetting agents and surfactants (e.g., a substituted or unsubstituted polyethylene glycol or a substituted or unsubstituted polypropylene glycol). An example of such suitable wetting agent is HSL-PT1, available from Moses Lake Industries, Moses Lake, Wash. In some embodiments, the pre-wetting liquid could also contain additives that are used in the electroplating liquid. Use of these compounds during pre-treatment mitigates the problems associated with slow diffusion rate of the additives at the beginning of electroplating.

In one embodiment, the pre-wetting liquid is an aqueous solution containing borate, KOH, and a compound from the class of polyalkyleneglycols (e.g., a substituted or unsubstituted polyethylene glycol or a substituted or unsubstituted polypropylene glycol), where the solution has a pH of between about 9 and about 12, such as about 11. In some embodiments the pre-wetting liquid contains borate at a concentration of between about 10 mM and about 1M, such as at a concentration of about 0.1M. The wetting liquid can be brought into contact with the substrate by any suitable method, such as by spraying of the liquid onto the substrate, streaming the liquid onto the substrate, immersion of the substrate into the liquid, etc. In some embodiments, spraying of the liquid onto a rotating substrate is preferred.

The cross-sectional view of the substrate after the pre-treatment is shown in FIG. 3B. A continuous wetting layer 108 of the pre-wetting liquid is formed on the substrate, thereby providing an alkaline buffer environment for the nickel-containing seed layer both at the bottom of the recess, on the recess sidewalls, and in the field region.

Next, in operation 405, a metal is electrodeposited onto the substrate using an acidic plating solution. During electrodeposition, the nickel-containing seed layer is negatively biased, such that the wafer substrate serves as a cathode. The substrate is brought into contact with a plating solution, which contains ions of the metal that is being plated, and, preferably, an acid. The plating solution may also contain additives. Examples of additives include accelerators, suppressors, and levelers. An exemplary plating solution for deposition of copper includes a copper salt (e.g., copper sulfate) an acid (e.g., sulfuric acid), an accelerator (e.g., bis-(3-sulfopropyl) disulfide, SPS), chloride ions, and a suppressor. The electroplating is performed for a sufficient time to at least partially fill the recessed features. In some embodiments, the recessed features are completely filled. The structure shown in FIG. 3C illustrates a recessed feature completely filled with copper 111 by electroplating. The underlying nickel-containing seed layer is not shown in this view to preserve clarity. Because the substrate was pre-treated with an alkaline buffer solution prior to contact with an acidic plating solution, no voids are formed within the filled recessed feature.

Next, in operation 407, excess metal is removed from the substrate. In some embodiments, unwanted metal deposited on the field region during electroplating, is subsequently removed using, for example, a chemical mechanical polishing or a wet etching technique. A structure of a substrate obtained after such metal removal is shown in FIG. 3D. In the illustrated embodiment, the substrate was planarized to remove the electrodeposited metal, and the underlying nickel-containing seed layer. In some embodiments, the diffusion barrier layer is then removed by a subsequent planarization operation.

Figure 5:
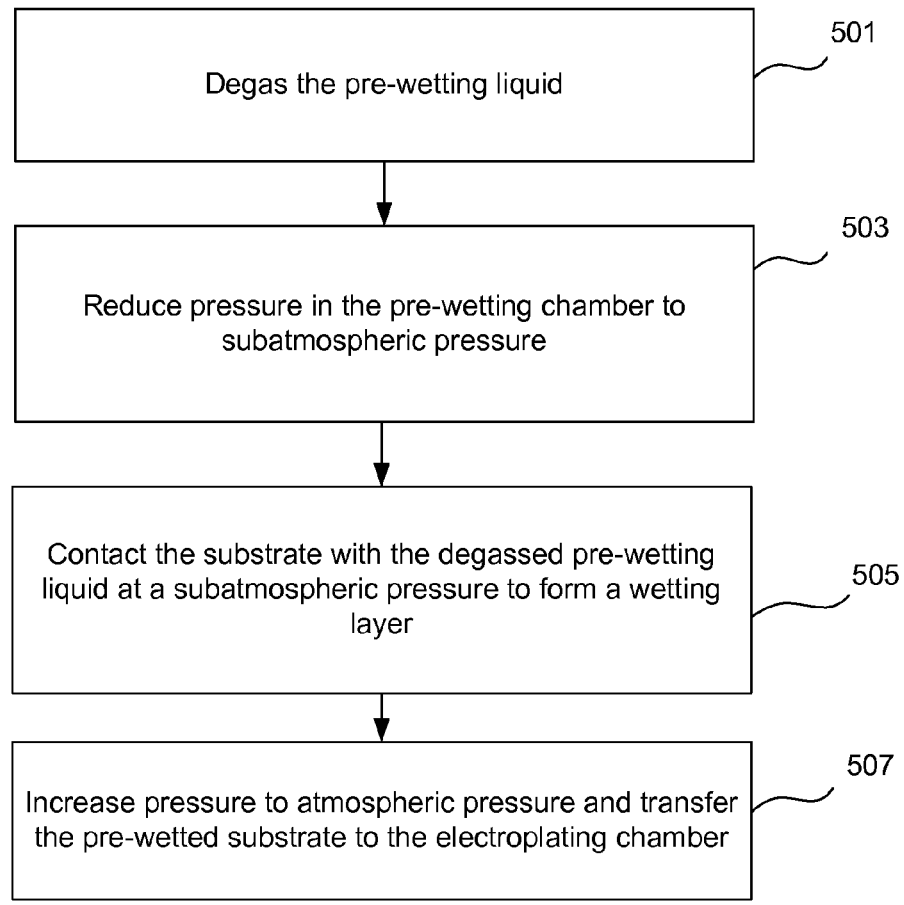
FIG. 5 presents a process flow diagram for a pretreatment method in accordance with an embodiment provided herein.

In some embodiments, particularly when processing substrates with features having widths of greater than 1 micron, special steps are taken to prevent formation of bubbles within the features on the substrate. These embodiments are illustrated by the pre-treatment process flow diagram shown in FIG. 5. In the operation 501, the pre-wetting liquid is degassed. In some embodiments degassing is performed to substantially remove both oxygen and nitrogen from the liquid. Such comprehensive degassing can be performed, for example, by passing the pre-wetting liquid through a membrane contact degasser. Examples of commercially available degassing devices include the Liquid-Cel™ from Membrana of Charlotte, N.C. and the pHasor™ from Entegris of Chaska, Minn. In the operation 503, the pressure in the pre-wetting process chamber that houses the wafer substrate is reduced to subatmospheric pressure. In some embodiments the pressure is reduced to between about 10-100 torr, such as to about 60 torr. In operation 505, the degassed pre-wetting liquid is brought into contact with the substrate located in the pre-wetting chamber. For example, the substrate may be rotated, while the degassed pre-wetting liquid is sprayed or streamed onto it. A continuous wetting layer is formed as a result of this operation, thereby minimizing the chance of bubble formation during subsequent electroplating. Next, in operation 507, the pressure is increased to atmospheric pressure in the pre-wetting chamber, and the pre-wetted substrate is transferred to the electroplating chamber for subsequent electrodeposition of metal into the recessed features. Details of apparatus and methods for pre-wetting under reduced pressure that can be used in conjunction with alkaline pre-wetting solutions provided herein, are described in the US Patent Application Pub. No. 2010/0320609 by Mayer et al., published on Dec. 23, 2010, titled "Wetting Pretreatment for Enhanced Damascene Metal Filling", which is herein incorporated by reference in its entirety.

Figure 6:
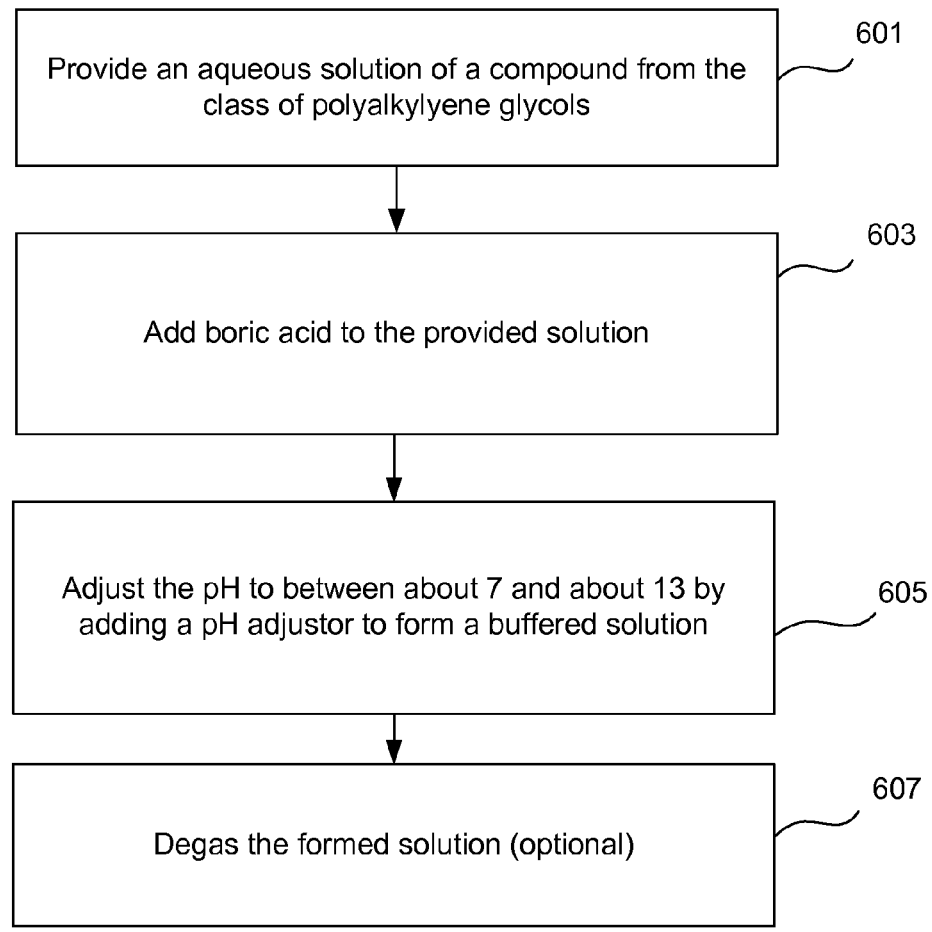
FIG. 6 presents a process flow diagram for a method of preparing a pre-wetting solution in accordance with an embodiment provided herein.

The pre-wetting solution suitable for alkaline pretreatment described herein can be prepared using a variety of method sequences. FIG. 6 shows one illustrative method for preparation of the pre-wetting solution containing a borate buffer. In operation 601, a solution of a compound from the class of polyalkylene glycols in water (such as in deionized water) is provided. Next, in operation 603, boric acid is added to this solution. Next, in operation 605, a pH adjustor (e.g., KOH, NaOH, TMAH, or $NH_3$) is added to the solution, until the pH of the solution reaches the desired value. The formed solution may then be optionally degassed in operation 607. In some embodiments, the pre-wetting solution consists essentially of water, buffering compound (e.g., borate, phosphate, citrate, carbonate or combinations thereof), a compound from the class of polyalkylene glycols, and a pH adjustor, where the pH of the solution is adjusted to the desired value.

The methods provided herein can be practiced in any type of apparatus which is configured for delivering a pre-wetting liquid onto a wafer. In some embodiments, the pre-treatment is performed in a separate pre-wetting chamber that is different from the electroplating chamber. In other embodiments, pre-treatment is performed in the electroplating chamber prior to electroplating.

Figure 7:
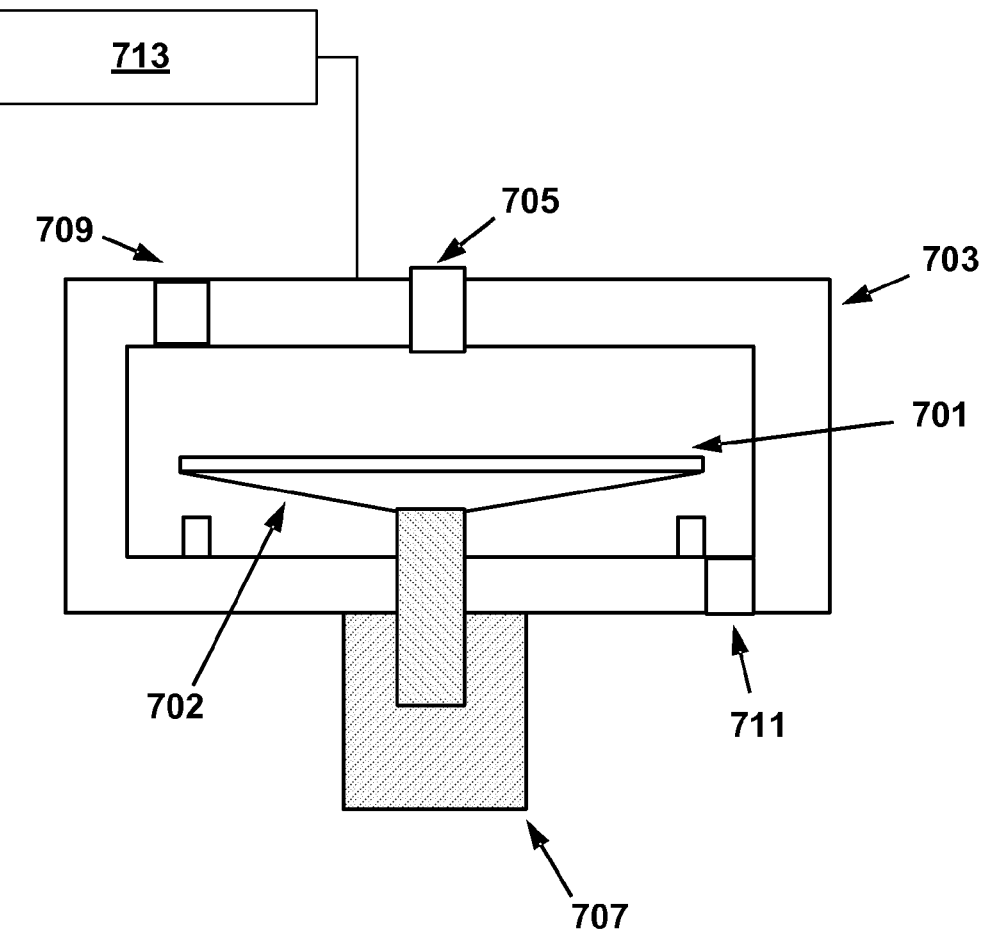
FIG. 7 is a simplified schematic presentation of a pre-wetting process chamber suitable for delivering the pre-wetting liquid provided herein.

In some embodiments, the substrate is pre-wetted in a pre-wetting chamber prior to electroplating, such that entrapment of bubbles in the recessed features is avoided. One embodiment of a pre-wetting chamber is shown in FIG. 7. The pre-wetting chamber, shown in this embodiment is configured for spraying or streaming the pre-wetting liquid onto the wafer substrate for a period of time. In FIG. 7, a wafer 701 is held face-up in the pre-wetting chamber 703 with wafer holder 702. In some embodiments, the wafer holder is configured to hold the wafer substrate in substantially a horizontal orientation during the pre-wetting process. In other embodiments, the wafer holder is configured to hold the wafer substrate in substantially a vertical orientation during the pre-wetting process.

In a typical operation, vacuum is first pulled on chamber 703 though vacuum port 709, which is connected to a vacuum system (not shown). This reduces the pressure in the chamber to a subatmospheric pressure. After much of the gas in the chamber is removed by the vacuum, pre-wetting liquid is delivered onto the wafer surface from the nozzle 705 or other mechanism. In some embodiments, the pre-wetting fluid is degassed prior to contacting the wafer surface to avoid gas being released as the pre-wetting fluid enters the vacuum environment. The wafer may be rotated with motor 707 during the pre-wetting fluid delivery process to ensure complete wetting and exposure of the wafer. In some embodiment, the pre-wetting liquid first contacts the rotating wafer substrate within about 3 cm of the center of the wafer substrate. After pre-wetting, the wafer is spun at a low rotation rate with motor 707 to remove entrained pre-wetting fluid, but leaving a thin layer of fluid on the wafer surface. Excess pre-wetting fluid is drained and exits the vacuum chamber through port 711. The wafer is then transferred to the plating cell such as a Novellus clamshell cell for plating with a thin layer of pre-wetting fluid retained by surface tension on its surface and within its features. The pre-wetting chamber will also typically include a controller 713 comprising program instructions and/or logic for performing various aspects of the pre-wetting process described herein.

In some embodiments, the pre-wetting chamber and the electroplating chamber are included in one module, which may include a controller with program instructions for transferring the substrate from the pre-wetting chamber to the electroplating chamber, after the pre-wetting has been completed.

Figure 8:
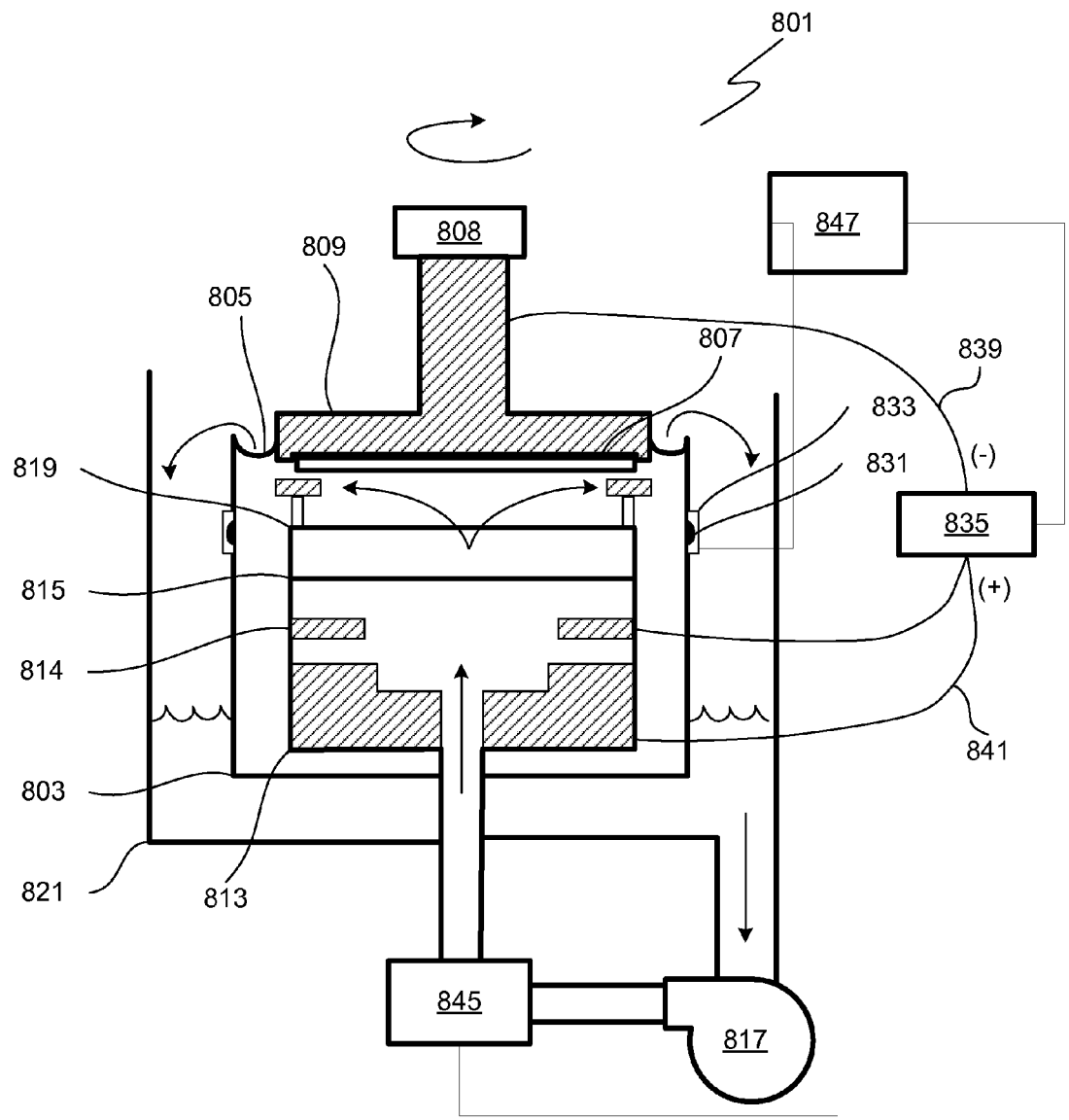
FIG. 8 is a simplified schematic presentation of an electroplating apparatus suitable for filling recessed features in accordance with an embodiment provided herein.

The apparatus in which the electroplating step is implemented, is illustrated in FIG. 8. The apparatus includes one or more electroplating cells in which the substrates (e.g., wafers) are processed. One electroplating cell is shown in FIG. 8 to preserve clarity. To optimize bottom-up electroplating, additives (e.g., accelerators and suppressors) are added to the electrolyte; however, an electrolyte with additives may react with the anode in undesirable ways. Therefore anodic and cathodic regions of the plating cell are sometimes separated by a membrane so that plating solutions of different composition may be used in each region. Plating solution in the cathodic region is called catholyte; and in the anodic region, anolyte. A number of engineering designs can be used in order to introduce anolyte and catholyte into the plating apparatus.

Referring to FIG. 8, a diagrammatical cross-sectional view of an electroplating apparatus 801 in accordance with one embodiment is shown. The plating bath 803 contains the plating solution (having a composition as provided herein), which is shown at a level 805. The catholyte portion of this vessel is adapted for receiving substrates in a catholyte. A wafer 807 is immersed into the plating solution and is held by, e.g., a "clamshell" holding fixture 809, mounted on a rotatable spindle 811, which allows rotation of clamshell 809 together with the wafer 807. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are incorporated herein by reference for all purposes.

An anode 813 is disposed below the wafer within the plating bath 803 and is separated from the wafer region by a membrane 815, preferably an ion selective membrane. For example, Nafion™ cationic exchange membrane (CEM)

may be used. The region below the anodic membrane is often referred to as an "anode chamber." The ion-selective anode membrane 815 allows ionic communication between the anodic and cathodic regions of the plating cell, while preventing the particles generated at the anode from entering the proximity of the wafer and contaminating it. The anode membrane is also useful in redistributing current flow during the plating process and thereby improving the plating uniformity. Detailed descriptions of suitable anodic membranes are provided in U.S. Pat. Nos. 6,126,798 and 6,569,299 issued to Reid et al., both incorporated herein by reference for all purposes. Ion exchange membranes, such as cationic exchange membranes are especially suitable for these applications. These membranes are typically made of ionomeric materials, such as perfluorinated co-polymers containing sulfonic groups (e.g. Nafion™), sulfonated polyimides, and other materials known to those of skill in the art to be suitable for cation exchange. Selected examples of suitable Nafion™ membranes include N324 and N424 membranes available from Dupont de Nemours Co.

During plating the ions from the plating solution are deposited on the substrate. The metal ions must diffuse through the diffusion boundary layer and into the TSV hole. A typical way to assist the diffusion is through convection flow of the electroplating solution provided by the pump 817. Additionally, a vibration agitation or sonic agitation member may be used as well as wafer rotation. For example, a vibration transducer 808 may be attached to the wafer chuck 809.

The plating solution is continuously provided to plating bath 803 by the pump 817. Generally, the plating solution flows upwards through an anode membrane 815 and a diffuser plate 819 to the center of wafer 807 and then radially outward and across wafer 807. The plating solution also may be provided into anodic region of the bath from the side of the plating bath 803. The plating solution then overflows plating bath 803 to an overflow reservoir 821. The plating solution is then filtered (not shown) and returned to pump 817 completing the recirculation of the plating solution. In certain configurations of the plating cell, a distinct electrolyte is circulated through the portion of the plating cell in which the anode is contained while mixing with the main plating solution is prevented using sparingly permeable membranes or ion selective membranes.

A reference electrode 831 is located on the outside of the plating bath 803 in a separate chamber 833, which chamber is replenished by overflow from the main plating bath 803. Alternatively, in some embodiments the reference electrode is positioned as close to the substrate surface as possible, and the reference electrode chamber is connected via a capillary tube or by another method, to the side of the wafer substrate or directly under the wafer substrate. In some of the preferred embodiments, the apparatus further includes contact sense leads that connect to the wafer periphery and which are configured to sense the potential of the metal seed layer at the periphery of the wafer but do not carry any current to the wafer.

A reference electrode 831 is typically employed when electroplating at a controlled potential is desired. The reference electrode 831 may be one of a variety of commonly used types such as mercury/mercury sulfate, silver chloride, saturated calomel, or copper metal. A contact sense lead in direct contact with the wafer 807 may be used in some embodiments, in addition to the reference electrode, for more accurate potential measurement (not shown).

A DC power supply 835 can be used to control current flow to the wafer 807. The power supply 835 has a negative output lead 839 electrically connected to wafer 807 through one or more slip rings, brushes and contacts (not shown). The positive output lead 841 of power supply 835 is electrically connected to an anode 813 located in plating bath 803. The power supply 835, a reference electrode 831, and a contact sense lead (not shown) can be connected to a system controller 847, which allows, among other functions, modulation of current and potential provided to the elements of electroplating cell. For example, the controller may allow electroplating in potential-controlled and current-controlled regimes. The controller may include program instructions specifying current and voltage levels that need to be applied to various elements of the plating cell, as well as times at which these levels need to be changed. When forward current is applied, the power supply 835 biases the wafer 807 to have a negative potential relative to anode 813. This causes an electrical current to flow from anode 813 to the wafer 807, and an electrochemical reduction (e.g. $Cu^{2+} + 2\,e^- = Cu^0$) occurs on the wafer surface (the cathode), which results in the deposition of the electrically conductive layer (e.g. copper) on the surfaces of the wafer. An inert anode 814 may be installed below the wafer 807 within the plating bath 803 and separated from the wafer region by the membrane 815.

The apparatus may also include a heater 845 for maintaining the temperature of the plating solution at a specific level. The plating solution may be used to transfer the heat to the other elements of the plating bath. For example, when a wafer 807 is loaded into the plating bath the heater 845 and the pump 817 may be turned on to circulate the plating solution through the electroplating apparatus 801, until the temperature throughout the apparatus becomes substantially uniform. In one embodiment the heater is connected to the system controller 847. The system controller 847 may be connected to a thermocouple to receive feedback of the plating solution temperature within the electroplating apparatus and determine the need for additional heating.

The controller will typically include one or more memory devices and one or more processors. The processor may include a CPU or computer, analog and/or digital input/output connections, stepper motor controller boards, etc. In certain embodiments, the controller controls all of the activities of the electroplating apparatus and/or of the pre-wetting chamber.

For example, the controller may include instructions for performing pretreatment and electroplating in accordance with any method described above or in the appended claims. Non-transitory machine-readable media containing instructions for controlling process operations in accordance with the present invention may be coupled to the system controller.

Typically there will be a user interface associated with controller 847. The user interface may include a display screen, graphical software displays of the apparatus and/or process conditions, and user input devices such as pointing devices, keyboards, touch screens, microphones, etc.

The computer program code for controlling electroplating processes can be written in any conventional computer readable programming language: for example, assembly language, C, C++, Pascal, Fortran or others. Compiled object code or script is executed by the processor to perform the tasks identified in the program.

In some embodiments the methods described herein will be implemented in a system which comprises an electroplating apparatus and a stepper.

EXPERIMENTAL

Example 1 (Comparative)

A wafer substrate containing a plurality of vias having 60 µm depth and 6 µm diameter at the opening, was used. The substrate had a NiB seed layer deposited by electroless deposition on a WN/W diffusion barrier bilayer. The substrate was sprayed with a degassed deionized water under subatmospheric pressure to form a wetting layer. The pressure was then increased to atmospheric, and the substrate was transferred from a pre-wetting chamber to an electroplating cell, where copper was electrodeposited to fill the recessed features using an acidic plating solution containing 60 g/L of copper ions, 60 g/L $H_2SO_4$, 50 ppm of chloride ions, and MLI HSL-A/B/C accelerator, suppressor, and leveler (available from Moses Lake Industries, Moses Lake, Wash.). Voids were observed in the scanning electron microscope (SEM) images of the filled vias. The voids were observed at the bottoms of the vias for the vias located in the center and in the middle portions of the wafer. No voids were observed in the vias located at the wafer edge.

Example 2 (Comparative)

The wafer substrate was processed as in the example 1, except that the pre-wetting liquid was HSL-PT1, a mixture containing a compound from the class of polyalkylene glycols available from Moses Lake Industries, Moses Lake, Wash. The voids were observed at the bottom of the vias, for the vias located at the center and middle portions of the wafer. No voids were observed in the vias located at the wafer edge.

Example 3

The wafer substrate was processed as in the example 1, except that the pre-wetting liquid had the following composition: mixture of HSL-PT1 (available from Moses Lake Industries, Moses Lake, Wash.), 50 mM boric acid, and ammonia, where ammonia was added to the solution to maintain the pH of 9. No voids were observed in the SEMs of all filled vias. However, vias at the edge of the wafer had more copper deposited on top of the filled vias than the vias in the center of the wafer.

Example 4

The wafer substrate was processed as in the example 1, except that the pre-wetting liquid had the following composition: mixture of HSL-PT1 (available from Moses Lake Industries, Moses Lake, Wash.), 50 mM boric acid, and KOH, where KOH was added to the solution to maintain the pH of 11. No voids were observed in the SEMs of all filled vias. The amount of copper deposited on top of the filled vias was significantly more uniform than in the example 3. All solutions described in the examples are aqueous solutions.

Alternative Embodiments

While it is preferable in many embodiments, to use pretreatment solutions that are buffers, in alternative embodiments highly alkaline solutions that do not have buffering capacity can be used for pretreatment. For example, in some embodiments the solutions have a pH of at least about 9, such as at least about 11, and contain a pH adjustor (e.g., an alkaline metal hydroxide, tetraalkylammonium hydroxide) and, optionally, a compound from the class of polyalkylene glycols. In some of these alternative embodiments, the solution consists essentially of water, a pH adjustor, as described above, and a compound from the class of polyalkylene glycols.

The invention claimed is:

1. A method of electroplating a metal on a wafer substrate comprising one or more recessed features, the method comprising:
   (a) providing a wafer substrate having an exposed nickel-containing layer on at least a portion of its surface;
   (b) contacting the wafer substrate with a pre-wetting liquid, the liquid comprising a buffer and having a pH in a range of between about 7 and about 13 to pre-wet the nickel-containing layer on the wafer substrate, wherein the wafer substrate retains the buffer-containing pre-wetting liquid after the pre-wetting; and
   (c) electrodepositing the metal onto the pre-wetted nickel-containing layer using an acidic plating solution, such that the acidic plating solution contacts the pre-wetting liquid retained on the wafer substrate, wherein the electrodeposited metal at least partially fills the one or more recessed features.

2. The method of claim 1, wherein the pre-wetting liquid comprises a borate and has a pH of between about 9 and about 11.

3. The method of claim 1, wherein the pre-wetting liquid comprises a phosphate.

4. The method of claim 1, wherein the pre-wetting liquid comprises a carbonate.

5. The method of claim 1, wherein the pre-wetting liquid comprises a pH adjustor selected from the group consisting of tetraalkylammonium hydroxide and an alkali metal hydroxide.

6. The method of claim 1, wherein the pre-wetting liquid comprises a pH adjustor, wherein the pH adjustor comprises ammonia.

7. The method of claim 1, wherein the pre-wetting liquid comprises a compound from the class of polyalkylene glycols.

8. The method of claim 1, further comprising degassing the pre-wetting liquid prior to contacting the wafer substrate.

9. The method of claim 1, further comprising reducing pressure in a pre-wetting process chamber to a subatmospheric pressure prior to contacting the wafer substrate with the pre-wetting liquid.

10. The method of claim 1, wherein the nickel-containing layer is a NiB layer.

11. The method of claim 1, wherein the nickel-containing layer is a NiP layer.

12. The method of claim 1, wherein the metal electrodeposited in (c) is copper.

13. The method of claim 1, wherein the one or more recessed features are through silicon vias (TSVs).

14. The method of claim 1, wherein the pre-wetting liquid comprises a borate, KOH, and a compound from the class of polyalkylene glycols and has a pH of about 11.

15. The method of claim 1, wherein the contacting comprises spraying the pre-wetting liquid onto the wafer substrate.

16. The method of claim 1, wherein the wafer substrate is positioned in a substantially horizontal orientation during the contacting.

17. The method of claim 1, wherein the buffer comprises a borate at a concentration of between about 10 mM to about 1 M.

18. The method of claim 1, further comprising:
applying photoresist to the wafer substrate;
exposing the photoresist to light;
patterning the photoresist and transferring the pattern to the wafer substrate;
and selectively removing the photoresist from the wafer substrate.

19. A pre-wetting liquid comprising:
(a) a borate buffer comprising borate and a pH adjustor selected from the group consisting of a tetraalkylammonium hydroxide and an alkaline metal hydroxide; and
(b) a compound from the class of polyalkylene glycols, wherein the pH of the pre-wetting liquid is between about 8 and about 13.

* * * * *